United States Patent
Karmazyn

(10) Patent No.: US 6,175,480 B1
(45) Date of Patent: Jan. 16, 2001

(54) THERMAL TRIP ARRANGEMENTS

(75) Inventor: Harry Karmazyn, Keyworth (GB)

(73) Assignee: Thomas & Betts, Memphis, TN (US)

( * ) Notice: Under 35 U.S.C. 154(b), the term of this patent shall be extended for 0 days.

(21) Appl. No.: 09/341,366

(22) PCT Filed: Jan. 6, 1998

(86) PCT No.: PCT/GB98/00025

§ 371 Date: Jul. 9, 1999

§ 102(e) Date: Jul. 9, 1999

(87) PCT Pub. No.: WO98/31203

PCT Pub. Date: Jul. 16, 1998

(30) Foreign Application Priority Data

Jan. 11, 1987 (GB) .................................................. 9700480

(51) Int. Cl.$^7$ ........................................................ H02H 5/04

(52) U.S. Cl. ........................... 361/103; 361/761; 174/260

(58) Field of Search .............................. 174/260; 361/761, 361/763, 766, 91.1, 91.5, 111, 117, 119, 124, 126, 127, 103, 106

(56) References Cited

U.S. PATENT DOCUMENTS

| | | | | |
|---|---|---|---|---|
| 2,777,039 | * | 1/1957 | Thias ..................................... | 361/761 |
| 2,869,041 | * | 1/1959 | Cola ...................................... | 361/761 |
| 3,049,647 | * | 8/1962 | Lincoln ................................. | 361/761 |
| 4,359,701 | * | 11/1982 | Aoki ...................................... | 361/417 |
| 5,124,876 | * | 6/1992 | Misencik et al. .................... | 361/117 |
| 5,311,164 | * | 5/1994 | Ikeda et al. .......................... | 361/124 |
| 5,366,935 | * | 11/1994 | Alim et al. ........................... | 501/20 |
| 5,420,755 | * | 5/1995 | Hiller .................................... | 361/761 |
| 5,999,412 | * | 12/1999 | Busse et al. ......................... | 361/761 |

\* cited by examiner

*Primary Examiner*—Ronald W. Leja
(74) *Attorney, Agent, or Firm*—G. Andrew Barger

(57) ABSTRACT

A varistor with no connecting legs extending from it, is mounted in a slot formed in a printed circuit board. The printed circuit board carries the normal circuit tracks. The physical and electrical connection between the printed circuit board and the varistor is achieved by the use of solder. When the varistor overheats to a temperature beyond a predetermined temperature, the solder melts and the varistor is separated from the printed circuit board. A leaf spring which is biased when the varistor is inserted into the slot pushes the varistor out of the slot when the solder melts. Alternatively, when the solder melts gravity causes the varistor to fall out of the printed circuit board.

13 Claims, 1 Drawing Sheet

THERMAL TRIP ARRANGEMENTS

The present invention concerns improvements in or relating to thermal trip arrangements, that is arrangements in electrical circuits which trip or cause a disconnection in the circuit when a predetermined temperature is exceeded.

Some types of electronic components are over-stretched or age and become irreversibly damaged and may, if connected to a power source, get very hot and even catch fire. In these circumstances use of some form of thermal trip or enclosure in a heat resistant housing becomes essential. Thermal trips which are currently employed include commercially available trip assemblies wired in series with the component which is liable to over-heat, or specifically designed circuitry including an external contact, springs and materials that react in predetermined ways at a specific temperature. The addition of external components of this nature not only increases the cost of the circuitry but adds to the thermal mass, making the device slower to operate.

Attempts have been made to incorporate thermal trip arrangements within the circuit including the component which is liable to overheat, utilising the overheat to trip the circuit. U.S. Pat. Nos. 5,311,164 and 4,486,804 are examples of such prior arrangements but in themselves, they suffer from disadvantages, for example neither are especially suitable for use when the component which is liable to overheat is a varistor. Additionally, these prior arrangements have incorporated components which are surface mounted to the circuit boards or other electronic components supporting elements. U.S. Pat. No. 5,311,164 shows a circuit absorbing element in the form an elongate cylinder which is secured on the surface of a base member and is effectively a separate member of the type described in the preceding paragraphs. The arrangement shown in U.S. Pat. No. 4,486,804 involving the use of coil springs on a component which is provided with standard leads is difficult and time consuming to mount on a printed circuit board.

It is the object of the present invention to obviate or mitigate these and other disadvantages.

According to the present invention there is provided a thermal trip arrangement including a thermal trip arrangement including a varistor mounted to a printed circuit board characterised in that the varistor comprises a voltage dependent resistor disc sandwiched between a pair of metallic electrically conducting discs and in that the printed circuit board provides mounting means for the varistor comprising an aperture through the printed circuit board for slidingly receiving the varistor with the central axis of its discs generally parallel to the plain of the circuit board, conducting tracks of the circuit board leading to each side of the aperture adjacent the conducting disc of a varistor mounted therein and heat sensitive fixing means providing electrical contact between said discs and tracks, the heat sensitive fixing means being adapted to hold the varistor in the aperture and release the varistor therefrom when the fixing means reach a predetermined temperature, the mounting means including also biasing means for urging the varistor out of the aperture.

Preferably the biasing means is resilient means. Alternatively the biasing means is gravity.

Preferably the metallic discs are of a diameter less than that of the metal oxide disc.

Preferably the fixing means is solder having a predetermined melting point.

Preferably an independent track of the printed circuit board connects with at least one side of the disc for use in an indicator circuit.

Preferably the resilient biasing means may be part of a switch/contact used to indicate normal operation of the circuit.

Alternatively, the resilient biasing means may operate a mechanical arrangement to give a visual indication of the operating condition of the circuit.

Further alternatively, movement of the disc under the action of the biasing means is used to operate a switch with a contact or mechanical indicator to indicate the operating condition of the circuit.

Preferably, where a plurality of thermal trip arrangements are provided in a circuit the indicator and/or resilient biasing means are coupled together.

Means may be provided to receive a displaced component.

Those parts of the component not in contact with mounting means may be coated to protect against environmental factors.

The conducting tracks on the printed circuit board may be of predetermined geometry to optimise the amount of solder present and its melting characteristics.

Further according to the present invention there is provided an electrical component for use in an arrangement as defined in the preceding fifteen paragraphs.

An embodiment of the present invention will now be described by way of example of with reference to the accompanying drawings in which:

FIGS. 1 and 2 respectively show front and side views of a currently employed, standard, metal oxide varistor;

Figure 1:
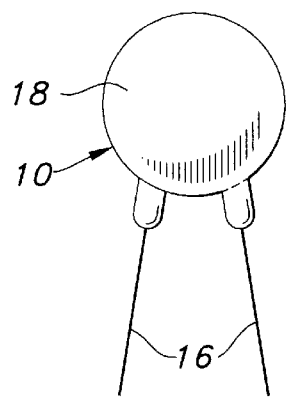
Figure 2:
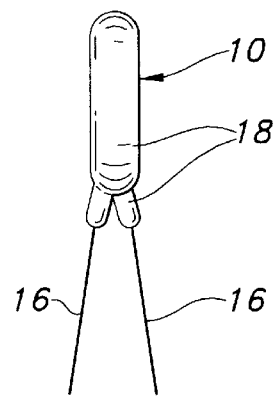
Figure 3:
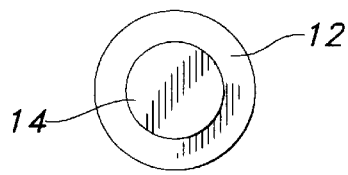
FIGS. 3 and 4 show respectively front and side views of a metal oxide varistor according to the present invention.
Figure 4:
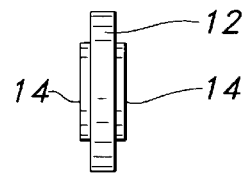

FIGS. 1 and 2 illustrate a currently available metal oxide varistor 10 which includes an electronic component similar to that illustrated in FIGS. 3 and 4, having a disc 12 of metal oxide sandwiched between two metal disc-like members 14, the outside diameter which is less than that of the metal oxide disc 12. A connection leg 16 is soldered to each metal disc 14 and the arrangement is covered by a coating 18, for example, of an epoxy resin, to provide mechanical and environmental protection. The connector legs 16 are fixed in a known manner to a printed circuit board and connect electrically therewith through solder attachments.

Whereas a metal oxide varistor is used to describe one embodiment of the present invention, it is to be realised that the invention is not restricted to this type of component but is applicable to any electronic component which includes two conducting members.

When some type of electronic components, for example metal oxide varistors, are overstressed or aged they become irreversibly damaged and may, if connected to a power source, get very hot and even catch fire. In these circumstances, some form of thermal trip or heat resistant enclosure becomes essential.

A metallic oxide varistor is a component used in surge or transient overvoltage protection. Often this component is placed across the mains supply with the purpose of surpressing any high voltage transients that may be present by diverting current through itself.

End of life occurs due to exceeding the current capacity of the device either by one single large event or more smaller events or by overstressing the device by applying a too high supply voltage continuously to it. If the overstress is very big the device tends to fail quickly and relatively cleanly.

However, if the overstress is small it fails slowly getting very hot in the period leading up to failure and emitting gaseous and solid matter. It is known to connect a fuse to disconnect the component when the overstress is big and a thermal device when the overstress is continuous or small.

Currently commercially available, or specifically designed and manufactured, trip arrangements are wired in series with the varistor and the present invention obviates the need for a separate component. According to the invention the varistor has no connecting legs extending from it and is essentially uncoated. A typical example is shown in FIGS. 3 to 6.

Figure 5:
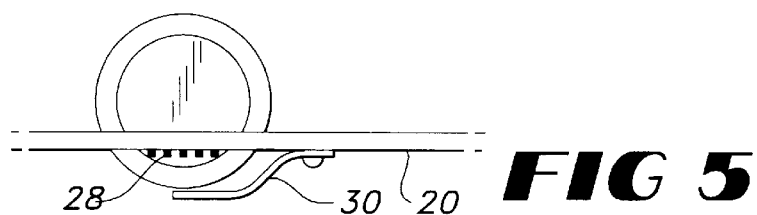
FIG. 5 shows a side view of a metal oxide varistor of the present invention mounted on a printed circuit board.
Figure 6:
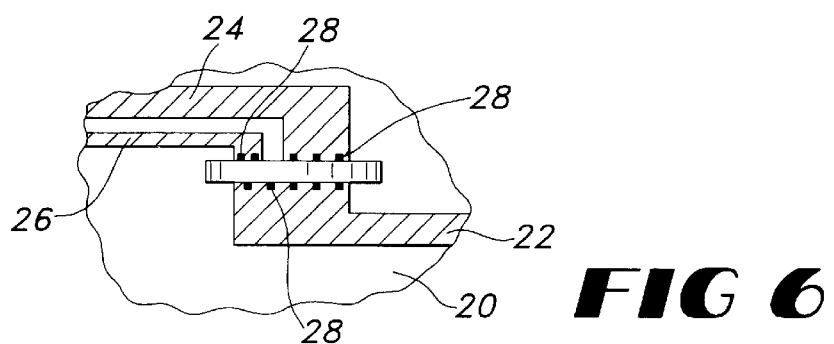
FIG. 6 shows a plan view of the arrangement shown in FIG. 5.

FIGS. 5 and 6 show that the varistor is mounted in a slot formed in a printed circuit board 20, the slot having a width which is only slighter greater than the thickness of the varistor across its metal members 14, and a length which is less than the diameter of the varistor, such that the varistor is accommodated in the slot in the manner illustrated in FIG. 5. The printed circuit board carries the normal circuit tracks 22,24,26. The physical and electrical connection between the printed circuit board 20 and the varistor is achieved by the use of solder illustrated in the drawings by the dots 28. If the resistor overheats to a temperature beyond the predetermined temperature then the solder melts, the solder composition being specially chosen such that it melts at the said predetermined temperature. If means are provided for separating the varistor from the board when the solder melts there is no supply to the varistor and consequently the problem of overheating, fire and the emission of gaseous and solid matter is overcome.

According to one embodiment of the present invention the varistor is suspended below the board 20, that is it is mounted in the position opposite to that shown in FIG. 5. With this arrangement, when the solder melts gravity causes the varistor to fall out of the printed circuit board.

In another arrangement illustrated in FIG. 5 a resilient member in the form of a leaf spring 30 which is biased when the varistor is inserted into the slot pushes the varistor out of the slot when the solder melts.

It will be realised that the surface area of the metal members 14 below the printed circuit board have sufficient area to allow an efficient solder joint to be made to each side of the varistor. The design of the printed circuit board tracks 22/26 also are designed to allow for this.

Further, the arrangement according to the present invention is compact, has low thermal mass and will operate quickly. As no contacts are present welding and jumping under transient conditions are not a problem.

In the printed circuit board 20 shown in FIG. 6 the circuit board track to one side of the varistor is split into two 24,26. Upon ejection of the varistor continuity on the split track is lost and this loss of continuity can be utilised to operate a visual or audible indicator of varistor failure.

Various modifications can be made without departing from the scope of the invention. As indicated above, the electronic component mounted in the printed circuit board in the manner according to the present invention need not be a varistor but could be any other appropriate component having two metallic electrical conducting elements.

The electronic component illustrated in FIGS. 5 and 6 is mounted to a printed circuit board but it could be mounted to any other suitable substrate and be ready for use in combination with another circuit.

The biasing means on the electronic component as described above is gravity or the leaf spring 30. Any other suitable biasing means may be employed either pushing the component from below the board, pulling it from above or rolling it from the side.

The leaf spring 30 may be part of a switch/contact used to indicate the condition of the circuit or may operate mechanical means giving a visual indication of the condition of the circuit.

In a further modification movement of the disc may be utilised to operate a switch/contact or mechanical circuit condition indicator.

In an arrangement where plurality of components of a similar type is employed the biasing means and/or the circuit condition indicators may be coupled together.

Depending upon the circumstances of use it may be considered advantageous to provide a receptacle for reception of an ejected component.

A partial coating may be applied to the component to protect those parts of it not in connection with the solder from environmental and mechanical damage.

Various other modifications can be made without departing from the scope of the invention.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. A thermal trip arrangement including a varistor mounted to a printed circuit board characterised in that the varistor comprises a voltage dependent resistor disc sandwiched between a pair of metallic electrically conducting discs and in that the printed circuit board provides mounting means for the varistor comprising an aperture through the printed circuit board for slidingly receiving the varistor with the central axis of its discs generally parallel to the plain of the circuit board, conducting tracks of the circuit board leading to each side of the aperture adjacent the conducting disc of the varistor mounted therein and heat sensitive fixing means providing electrical contact between said discs and tracks, the heat sensitive fixing means being adapted to hold the varistor in the aperture and release the varistor therefrom when the fixing means reach a predetermined temperature, the mounting means including also biasing means for urging the varistor out of the aperture.

2. An arrangement according to claim 1, in which the metallic discs are of a diameter less than that of the the resistor disc.

3. An arrangement according to claim 1, in which the heat sensitive fixing means is solder having a predetermined melting point.

4. An arrangement according to claim 3, in which the conducting tracks on the circuit board are of predetermined geometry to optimise the amount of heat sensitive fixing means present and its melting characteristics.

5. An arrangement according to claim 1, in which an independent track of the circuit board connects with at least one side of the varistor for use in an indicator circuit.

6. An arrangement according to claim 1, in which the biasing means is gravity.

7. An arrangement according to claim 1, in which the biasing means is resilient means.

8. An arrangement according to claim 7, in which the resilient biasing means forms part of a switch/contact used to indicate normal operation of a circuit.

9. An arrangement according to claim 7, in which the resilient biasing means operates a mechanical arrangement to give a visual indication of the operating condition of a circuit.

10. An arrangement according to claim 7, in which movement of the varistor under the action of the biasing means operates a switch with a contact or mechanical indicator to indicate the operating condition of a circuit.

11. An arrangement in which a plurality of thermal trip arrangements according to claim 7, are provided in a circuit, and in which the visual indication and resilient biasing means are coupled together.

12. An arrangement according to claim 1, in which means are provided to receive the varistor released by the fixing means.

13. An arrangement according to claim 1, in which those parts of the varistor not in contact with the mounting means are coated to protect against environmental factors.

\* \* \* \* \*